(12) United States Patent
Zhou (10) Patent No.: US 12,176,420 B2
(45) Date of Patent: Dec. 24, 2024

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 239 days.

(21) Appl. No.: 17/313,239

(22) Filed: May 6, 2021

(65) Prior Publication Data

US 2022/0077303 A1 Mar. 10, 2022

(30) Foreign Application Priority Data

Sep. 7, 2020 (CN) .......................... 202010928112.9

(51) Int. Cl.
*H01L 29/66* (2006.01)
*H01L 21/8234* (2006.01)
*H01L 29/78* (2006.01)

(52) U.S. Cl.
CPC ............... *H01L 29/66795* (2013.01); *H01L 21/823431* (2013.01); *H01L 29/7848* (2013.01); *H01L 29/7851* (2013.01)

(58) Field of Classification Search
CPC ............. H01L 27/0886; H01L 27/0211; H01L 29/7848; H01L 29/66545; H01L 21/823431
See application file for complete search history.

(56) References Cited

U.S. PATENT DOCUMENTS

| 2009/0194824 A1* | 8/2009 | Wirbeleit ............... H10B 10/00 257/393 |
| 2016/0343706 A1* | 11/2016 | Chang ............... H01L 21/76224 |
| 2018/0040620 A1* | 2/2018 | Ha ..................... H01L 29/66818 |
| 2018/0190652 A1* | 7/2018 | Ching ............. H01L 21/823418 |
| 2019/0355721 A1* | 11/2019 | Jambunathan ........ H01L 29/785 |
| 2020/0006341 A1* | 1/2020 | Hong ............... H01L 21/823821 |

* cited by examiner

*Primary Examiner* — Tuan A Hoang
(74) *Attorney, Agent, or Firm* — Crowell & Moring LLP (57) ABSTRACT

A semiconductor structure and a method for forming the same are provided. One form of a semiconductor structure includes: a substrate including a device unit region, where the device unit region includes a first sub-unit region configured to form a first device and a second sub-unit region configured to form a second device, where a driving current of the first device is greater than a driving current of the second device; a fin protruding from the substrate; a first gate spanning the fin in the first sub-unit region; and a second gate spanning the fin in the second sub-unit region. In some implementations, the second sub-unit region is disposed in the device unit region, and the second device generates less heat than the first device. Therefore, compared with a solution in which the device unit region includes only a first device region, overall heat from the device unit region can be reduced, thus ameliorating a self-heating effect in the device unit region and enhancing the performance of semiconductors.

14 Claims, 5 Drawing Sheets

SEMICONDUCTOR STRUCTURE AND METHOD FOR FORMING THE SAME

RELATED APPLICATIONS

The present application claims priority to Chinese Patent Appln. No. 202010928112.9, filed Sep. 7, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming the same.

Related Art

As semiconductor manufacturing technology evolves, there is a decreasing trend for semiconductor process nodes to follow the Moore's Law. In order to adapt to a reduction in process nodes, a channel length of a MOSFET needs to be constantly reduced.

However, with the reduction in a channel length, a distance between a source and a drain of the device is also shortened. As a result, a gate is less capable of controlling a channel, resulting in a higher probability that sub-threshold leakage, that is, the so-called short-channel effect (SCE) occurs.

SUMMARY

In order to better meet the requirement of the scaling-down of dimensions of the device, a non-planar MOS transistor comes into being, for example, a gate-all-around (GAA) transistor or a fin field effect transistor (FinFET). In the FinFET, the gate may control an ultra-thin body (fin) from at least two sides. The gate has a greater capability of controlling the channel than a planar MOSFET device, thus enabling a good effect of preventing the short-channel effect. Moreover, compared to other devices, the FinFET is more compatible with manufacturing of a current integrated circuit.

To address problems such as those described above, embodiments and implementations of the present disclosure provide a semiconductor structure and a method for forming the same, to enhance performance of a semiconductor structure.

One form of the present disclosure provides a semiconductor structure that includes: a substrate including a device unit region, where the device unit region includes a first sub-unit region configured to form a first device and a second sub-unit region configured to form a second device, where a driving current of the first device is greater than a driving current of the second device; a fin protruding from the substrate; a first gate spanning the fin in the first sub-unit region; and a second gate spanning the fin in the second sub-unit region.

In some implementations, a threshold voltage of the second device is greater than a threshold voltage of the first device.

In some implementations, a difference between the threshold voltage of the second device and the threshold voltage of the first device ranges from 40 mV to 200 mV.

In some implementations, a width of the second gate is greater than a width of the first gate.

In some implementations, a difference between the width of the second gate and the width of the first gate ranges from 4 nanometers to 100 nanometers. In some implementations, the semiconductor structure further includes: source/drain doped regions located in the fin on both sides of the first gate and in the fin on both sides of the second gate, where doping ions in the source/drain doped regions are first-type ions; and an inversely-doped region located in the fin at a bottom of the second gate, where doping ions in the inversely-doped region are second-type ions, where a conductivity type of the second-type ions is different from a conductivity type of the first-type ions.

In some implementations, the device unit region is an NMOS region, the first-type ions are N-type ions, and the second-type ions are P-type ions; or the device unit region is a PMOS region, the first-type ions are P-type ions, and the second-type ions are N-type ions.

In some implementations, the device unit region includes a plurality of first sub-unit regions, and the second sub-unit region is located between the adjacent first sub-unit regions.

In some implementations, the first sub-unit region includes 1 to 6 first gates.

In some implementations, the second sub-unit region includes 1 to 3 second gates.

Another form of the present disclosure further provides a method for forming a semiconductor structure. One form of a method includes: providing a substrate and a fin protruding from the substrate, where the substrate includes a device unit region, where the device unit region includes a first sub-unit region configured to form a first device and a second sub-unit region configured to form a second device, where a driving current of the first device is greater than a driving current of the second device; and forming a first gate spanning the fin in the first sub-unit region and a second gate spanning the fin in the second sub-unit region.

In some implementations, a threshold voltage of the second device is greater than a threshold voltage of the first device.

In some implementations, a difference between the threshold voltage of the second device and the threshold voltage of the first device ranges from 40 mV to 200 mV. In some implementations, a width of the second gate is greater than a width of the first gate. In some implementations, a difference between the width of the second gate and the width of the first gate ranges from 4 nanometers to 100 nanometers.

In some implementations, before forming the first gate and the second gate, the forming method further includes: forming dummy gate structures respectively spanning the fin in the first sub-unit region and the fin in the second sub-unit region; forming source/drain doped regions in the fin on both sides of the dummy gate structures, where doping ions in the source/drain doped regions are first-type ions; forming an interlayer dielectric layer on the substrate exposed from the dummy gate structures after the forming the source/drain doped regions, where the interlayer dielectric layer covers side walls of the dummy gate structures; removing the dummy gate structures to form gate openings in the interlayer dielectric layer; injecting second-type ions into the fin at a bottom of the gate openings in the second sub-unit region to form an inversely-doped region, where a conductivity type of the second-type ions is different from a conductivity type of the first-type ions; and forming the first gate and the second gate in the gate openings after the forming the inversely-doped region.

In some implementations, the device unit region is an NMOS region, the first-type ions are N-type ions, and the second-type ions are P-type ions; or the device unit region is a PMOS region, the first-type ions are P-type ions, and the second-type ions are N-type ions.

In some implementations, the device unit region includes a plurality of first sub-unit regions, and the second sub-unit region is located between the adjacent first sub-unit regions.

In some implementations, the first sub-unit region includes 1 to 6 first gates.

In some implementations, the second sub-unit region includes 1 to 3 second gates. Compared to the prior art, the technical solutions of embodiments and implementations of the present disclosure have the following advantages.

In solutions disclosed in embodiments and implementations of the present disclosure, the device unit region includes the first sub-unit region configured to form the first device and the second sub-unit region configured to form the second device, the first gate is formed on the fin in the first sub-unit region, and the second gate is formed on the fin in the second sub-unit region. During operation of the devices, the driving current of the first device is greater than the driving current of the second device, so that more heat is generated in the first sub-unit region. Therefore, compared with a solution in which the device unit region includes only the first device region, in embodiments and implementations of the present disclosure, by disposing the second sub-unit region in the device unit region, less heat is generated during the operation of the second device, so that overall heat from the device unit region can be reduced, thus ameliorating a self-heating effect in the device unit region, and enhancing the performance of semiconductors accordingly.

DETAILED DESCRIPTION

Figure 1:
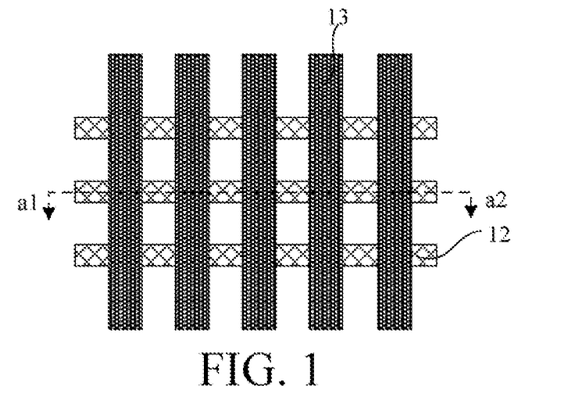
FIG. 1 and FIG. 2 are schematic structural diagrams corresponding to a semiconductor structure.
Figure 2:
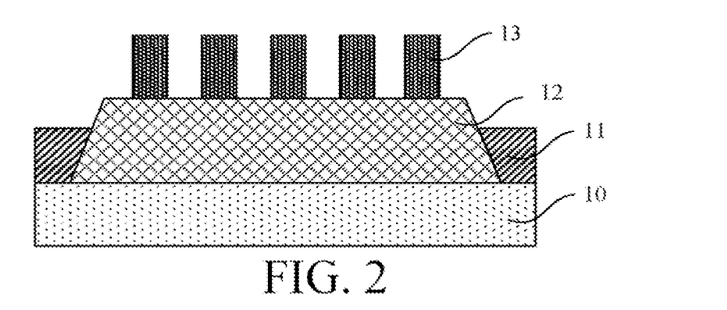

A performance of a semiconductor structure is able to be improved. Reasons why a performance of a semiconductor structure is able to be improved are now analyzed in combination with a semiconductor structure. FIG. 1 and FIG. 2 are schematic structural diagrams corresponding to a semiconductor structure. FIG. 1 is a top view, and FIG. 2 is a cross-sectional view of FIG. 1 taken along line a1a2.

Referring to FIG. 1 and FIG. 2, one form of a semiconductor structure includes: a substrate 10; a fin 12 protruding from the substrate 10; an isolation structure 11 located on the substrate 10 exposed from the fin 12, where the isolation structure 11 covers a part of a side wall of the fin 12; gate structures 13 located on the isolation structure 11, where the gate structures 13 span the fin 12 and cover a part of a top and a part of the side wall of the fin 12.

A part at which the gate structure 13 and the fin 12 intersect is configured to form a device (for example, an NMOS transistor or a PMOS transistor). Moreover, heat is generated during operation of the device.

During operation of the device, since a driving current flows through the device, heat is to be generated.

Compared with a planar transistor, the isolation structure 11 occupies more space in a fin field effect transistor, and an area of a contact surface between the fin 12 and the substrate 10 is relatively small, degrading a heat dissipation effect of the device.

Moreover, the isolation structure 11 is usually made of silicon oxide. Silicon oxide has a lower thermal conductivity than a material of the substrate 10, which further degrades the heat dissipation effect of the device, resulting in a more serious self-heating effect of the device. Therefore, the performance of the device accordingly degrades more greatly.

To address the technical problem, a form of the present disclosure provides a semiconductor structure. The semiconductor structure includes: a substrate including a device unit region, where the device unit region includes a first sub-unit region configured to form a first device and a second sub-unit region configured to form a second device, where a driving current of the first device is greater than a driving current of the second device; a fin protruding from the substrate; a first gate spanning the fin in the first sub-unit region; and a second gate spanning the fin in the second sub-unit region.

In solutions disclosed in embodiments and implementations of the present disclosure, forms of the device unit region includes the first sub-unit region configured to form the first device and the second sub-unit region configured to form the second device, the first gate is formed on the fin in the first sub-unit region, and the second gate is formed on the fin in the second sub-unit region. During operation of the devices, the driving current of the first device is greater than the driving current of the second device, so that more heat is generated in the first sub-unit region. Therefore, compared with a solution in which the device unit region includes only the first device region, in embodiments and implementations of the present disclosure, by disposing the second sub-unit region in the device unit region, less heat is generated during the operation of the second device, so that overall heat from the device unit region can be reduced, thereby ameliorating a self-heating effect in the device unit region, and enhancing the performance of semiconductors accordingly.

In order to make the foregoing objectives, features, and advantages of embodiments and implementations of the present disclosure more apparent and easier to understand, specific embodiments and implementations of the present disclosure are described in detail below with reference to the accompanying drawings.

FIG. 3 to FIG. 11 are schematic structural diagrams corresponding to steps in one form of a method for forming a semiconductor structure according to the present disclosure.

Figure 3:
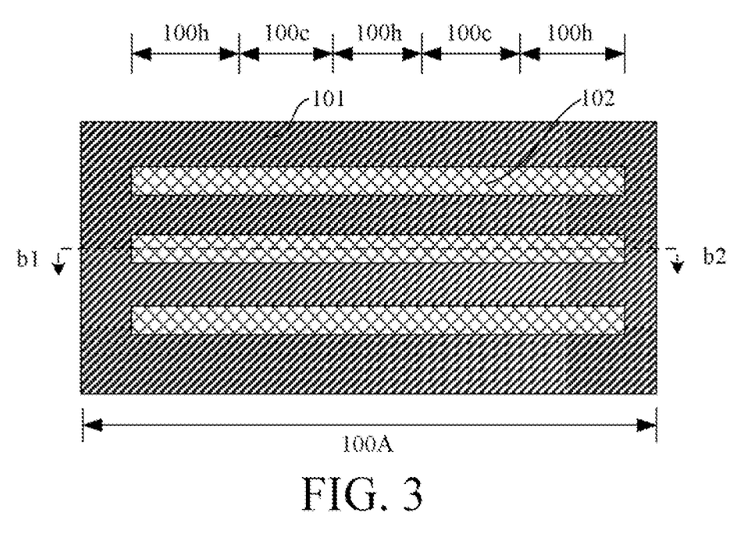
FIG. 3 to FIG. 11 are schematic structural diagrams corresponding to steps in one form of a method for forming a semiconductor structure.
Figure 4:
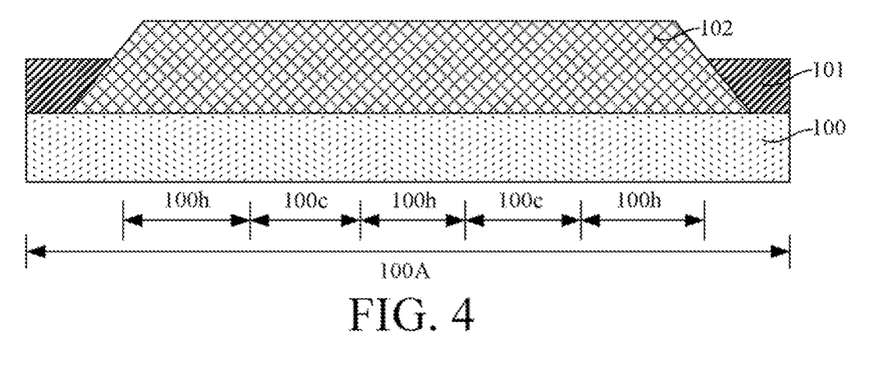

Referring to FIG. 3 and FIG. 4, FIG. 3 is a top view, and FIG. 4 is a cross-sectional view of FIG. 3 taken along line b1b2. A substrate 100 and a fin 102 protruding from the substrate 100 are provided. The substrate 100 includes a device unit region 100A, the device unit region 100A includes a first sub-unit region 100h configured to form a first device and a second sub-unit region 100c configured to form a second device, and a driving current of the first device is greater than a driving current of the second device.

The substrate 100 is configured to provide a process platform for a subsequent process.

In some implementations, the substrate 100 is made of silicon. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

The fin 102 is configured to provide a channel for operation of a device.

In some implementations, the fin 102 is made of the same material as the substrate 100, and the fin 102 is made of silicon.

In some implementations, the device unit region 100A includes the first sub-unit region 100h configured to form the first device and the second sub-unit region 100c configured to form the second device, and the driving current of the first device is greater than the driving current of the second device.

During operation of the devices, the driving current of the first device is greater than the driving current of the second device, so that more heat is generated in the first sub-unit region 100h. Therefore, compared with a solution in which the device unit region includes only the first device region 100h, in some implementations, by disposing the second sub-unit region 100c in the device unit region 100A, less heat is generated during the operation of the second device, so that overall heat from the device unit region 100A can be reduced thus ameliorating a self-heating effect in the device unit region 100A, and enhancing the performance of semiconductors accordingly.

In some implementations, the device unit region 100A includes a plurality of first sub-unit regions 100h, and the second sub-unit region 100c is located between the adjacent first sub-unit regions 100h.

The driving current of the first device is greater than the driving current of the second device, so that more heat is generated in the first sub-unit region 100h than in the second sub-unit region 100c. Therefore, disposing the second sub-unit region 100c between the adjacent first sub-unit regions 100h helps avoid accumulation of heat in a specific region, so that the self-heating effect in the device unit region 100A can be greatly improved.

In some implementations, the method for forming a semiconductor structure further includes: forming an isolation layer 101 on the substrate 100 exposed from the fin 102 after the forming the fin 102, where the isolation layer 101 covers a part of a side wall of the fin 102, and a top of the isolation layer 101 is lower than a top of the fin 102.

The isolation layer 101 is configured to isolate adjacent devices from each other. The isolation layer 101 may be made of silicon oxide, silicon nitride, or silicon oxynitride. In some implementations, the isolation layer 102 is made of silicon nitride.

Referring to FIG. 5 to FIG. 11, a first gate 114 (shown in FIG. 11) spanning the fin 102 in the first sub-unit region 100h and a second gate 120 (shown in FIG. 11) spanning the fin 102 in the second sub-unit region 100c are formed.

Figure 11:
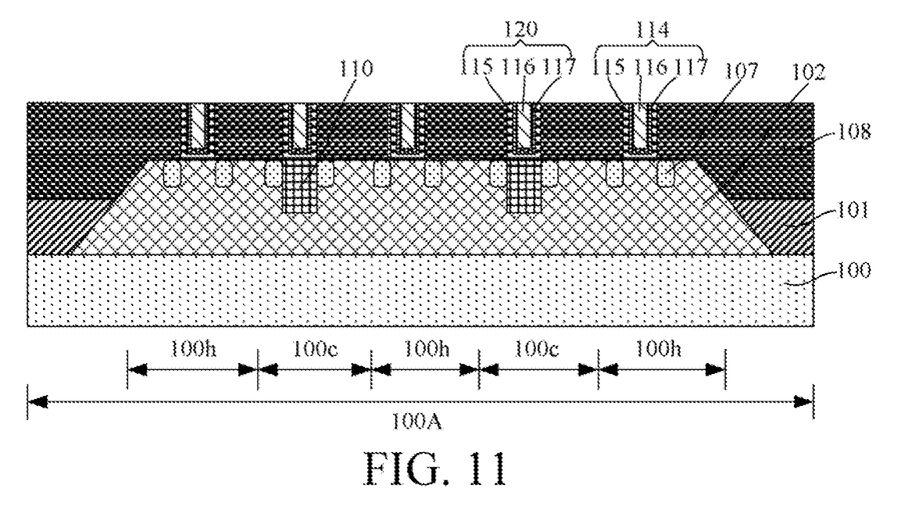

A part at which the first gate 114 and the fin 102 intersect is configured to form a first device, and a part at which the second gate 120 and the fin 102 intersect is configured to form a second device.

In some implementations, the first gate 114 serves as a device gate configured to control opening and closing of a channel for the first device in the first sub-unit region 100h.

In some implementations, the second gate 120 serves as a dummy gate. Therefore, the second device is a dummy device, and the second device is out of operation.

In other implementations, the second gate may also serve as a device gate configured to control opening and closing of a channel for the second device in the second sub-unit region.

In some implementations, the first gate 114 and the second gate 120 have the same width, and the first gate 114 and the second gate 120 are made of the same material and include film layers of the same thickness.

It should be noted that a number of the first gates 114 in the first sub-unit region 100h should be neither excessively small nor excessively large. If the number of the first gates 114 is excessively large, a local temperature of the first sub-unit region 100h is likely to be excessively high, causing a temperature of the device unit region 100A to rise excessively fast, thus reducing an effect of the second device, that is, resulting a non-significant effect of reducing overall heat from the device unit region 100A. As a result, it is difficult to improve a self-heating effect of the device unit region 100A. If the number of the first gates 114 is excessively small, pattern density of the first gate 114 is correspondingly reduced, thus reducing utilization of a base. As a result, it is difficult to improve device integration. To this end, in some implementations, the first sub-unit region 100h includes 1 to 6 first gates 114. For example, there are 2, 3, 4, or 5 first gates 114.

It should be further noted that a number of the second gates 120 in the second sub-unit region 100c should be neither excessively small nor excessively large. An excessively large number of the second gates 120 may accordingly lead to an excessively small number of the first gates 114, which is likely to affect operating performance of a semiconductor, thus reducing operating efficiency of the semiconductor, and reducing the utilization of the base. As a result, it is difficult to improve the device integration. If the number of the second gates 120 is excessively small, the second device is incapable of significantly reducing the overall heat from the device unit region 100A. As a result, it is difficult to improve the self-heating effect of the device unit region 100A. To this end, in some implementations, the second sub-unit region 100c includes 1 to 3 second gates 120. For example, there are two second gates 120.

In some implementations, the first gate 114 and the second gate 120 are formed through a high-k last metal gate-last process.

Figure 5:
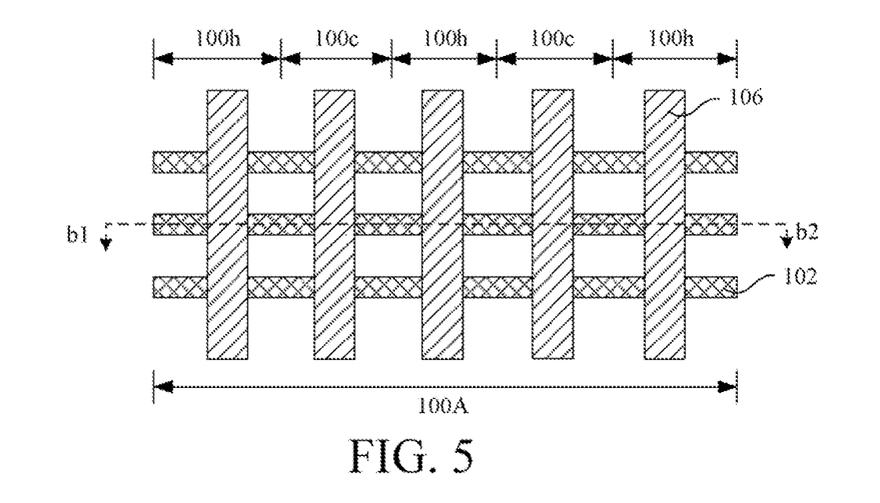
Figure 6:
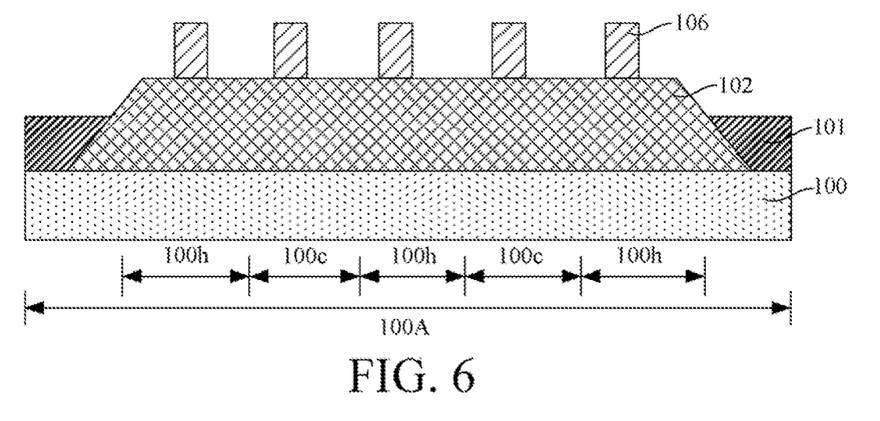

Referring to FIG. 5 and FIG. 6, FIG. 5 is a top view, and FIG. 6 is a cross-sectional view of FIG. 5 along line b1b2. Therefore, before the first gate 114 and the second gate 120 are formed, the method for forming a semiconductor structure further includes: forming dummy gate structures 106 respectively spanning the fin 102 in the first sub-unit region 100h and the fin 102 in the second sub-unit region 100c.

For ease of illustration, FIG. 5 illustrates only the fin 102 and the dummy gate structures 106.

The dummy gate structures 106 are space reserved for forming the first gate and the second gate in a subsequent manufacturing process.

In some implementations, the dummy gate structure 106 is a polysilicon gate structure, that is, the dummy gate structure 106 includes a dummy gate layer. The dummy gate layer is made of polysilicon.

In other implementations, the dummy gate layer may also be made of other materials such as silicon oxide, silicon nitride, silicon oxynitride, silicon carbide, silicon carbonitride, silicon oxycarbonitride, or amorphous carbon.

As an example, the dummy gate structure 106 is a single-layer structure, and the dummy gate structure 106 includes only the dummy gate layer.

In other implementations, the dummy gate structure may also be a laminated structure, which correspondingly includes a dummy gate oxide layer and a dummy gate layer located on the dummy gate oxide layer.

In some implementations, in order to meet process requirements for a constant decrease in feature sizes of the device, the dummy gate structure 106 is formed through a multi-patterning mask process. The multi-patterning mask process includes: a self-aligned double patterned (SADP) process, a self-aligned triple patterning$_{[sy1]}$ (SATP) process, or a self-aligned quadruple patterning (SAQP) process, a litho-eth-litho-etch (LELE) process, and the like.

As an example, the dummy gate structure 106 is formed through the SADP process. Specifically, the step of forming the dummy gate structures 106 includes: forming a dummy gate material layer (not shown) covering the substrate 100 and the fin 102; forming a mandrel layer on the dummy gate material layer; forming a mask spacer on a side wall of the mandrel layer; removing the mandrel layer after the forming the mask spacer; and etching the dummy gate material layer by using the mask spacer as a mask after the mandrel layer is removed, to form the dummy gate structure 106.

In some implementations, the mask spacer is made of silicon nitride. In some other implementations, the mask spacer may also be made of silicon oxide. In other implementations, the mask spacer 103 may also be made of silicon oxynitride, silicon oxycarbide, or silicon oxycarbonitride.

It should be noted that, after the forming the dummy gate structures 106, the forming method further includes: forming spacers (not shown) on side walls of the dummy gate structures 106.

The spacers are configured to protect the side walls of the dummy gate structures 106 and further configured to define positions at which source/drain doped regions 107 are subsequently formed.

The spacer may be a single-layer structure or a laminated structure, and may be made of one or more of silicon oxide, silicon nitride, silicon carbide, silicon carbonitride, silicon oxycarbonitride, silicon oxynitride, boron nitride, and boron carbonitride. In some implementations, the spacer is a single-layer structure, and the spacer is made of silicon nitride.

Figure 7:
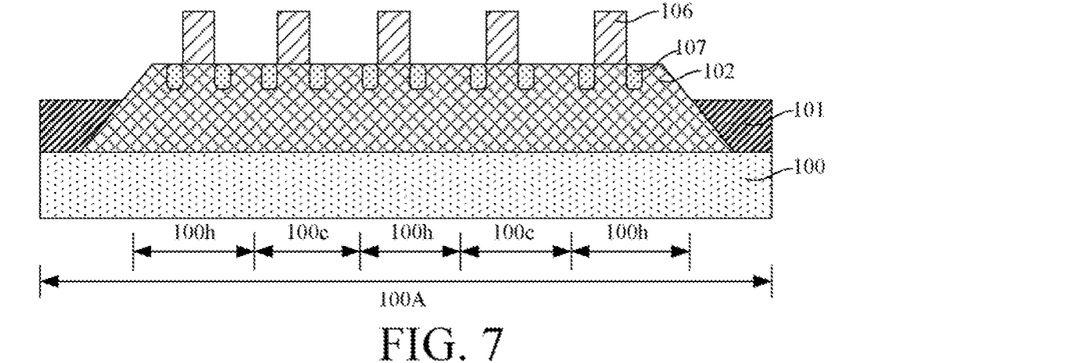

Referring to FIG. 7, FIG. 7 is a cross-sectional view based on FIG. 6. Source/drain doped regions 107 are formed in the fin 102 on both sides of the dummy gate structures 106. Doping ions in the source/drain doped regions 107 are first-type ions.

The source/drain doped regions 107 are configured to serve as a source region or a drain region of a transistor. In some implementations, the source/drain doped regions 107 are formed through an epitaxial process.

When an NMOS transistor is formed, the source/drain doped regions 107 include a stress layer doped with N-type ions, that is, the first-type ions are N-type ions.

Specifically, the stress layer is made of Si or SiC, and the stress layer provides compression stress for a channel region of the NMOS transistor, thereby facilitating improvement of carrier mobility of the NMOS transistor. The N-type ion is a P ion, an As ion, or an Sb ion.

When a PMOS transistor is formed, the source/drain doped regions 107 include a stress layer doped with P-type ions, that is, second-type ions are P-type ions.

The stress layer is made of Si or SiGe, and the stress layer provides compression stress for a channel region of the PMOS transistor, thereby facilitating improvement of carrier mobility of the PMOS transistor. The P-type ion is a B ion, a Ga ion, or an In ion.

Figure 8:
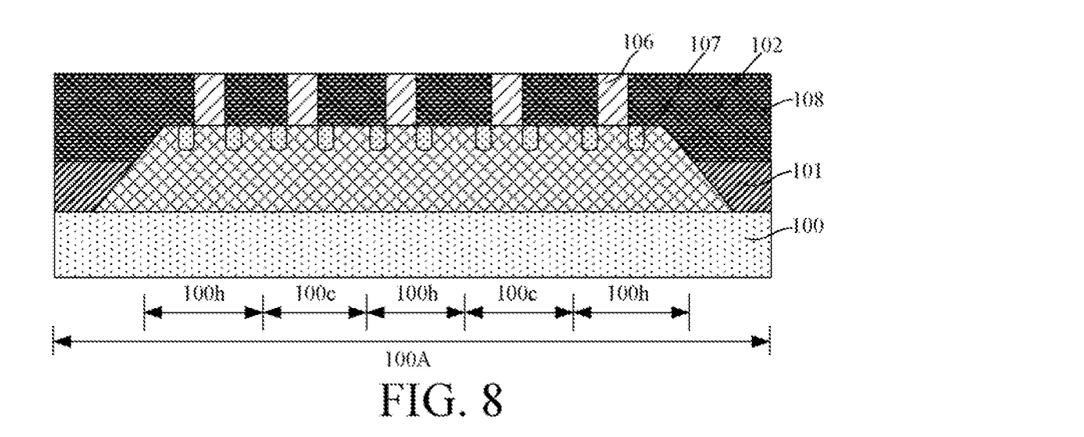

Referring to FIG. 8, an interlayer dielectric layer 108 is formed on the substrate 100 exposed from the dummy gate structures 106 after the source/drain doped regions 107 are formed. The interlayer dielectric layer 108 covers side walls of the dummy gate structures 106.

The interlayer dielectric layer 108 is configured to isolate adjacent devices from each other.

The interlayer dielectric layer 108 is made of an insulating material such as one or more of silicon oxide, silicon nitride, silicon oxynitride, silicon oxycarbide, silicon carbonitride, and silicon oxycarbonitride. In some implementations, the interlayer dielectric layer 108 is made of silicon nitride.

In some implementations, the interlayer dielectric layer 108 is formed by successively performing a deposition process and a planarization process (for example, a chemical mechanical polishing process).

It should be noted that a mask spacer is formed on tops of the dummy gate structures 106. During formation of the interlayer dielectric layer 108, the mask spacer is removed. Therefore, the top of the interlayer dielectric layer 108 is flush with the tops of the dummy gate structures 106.

Figure 9:
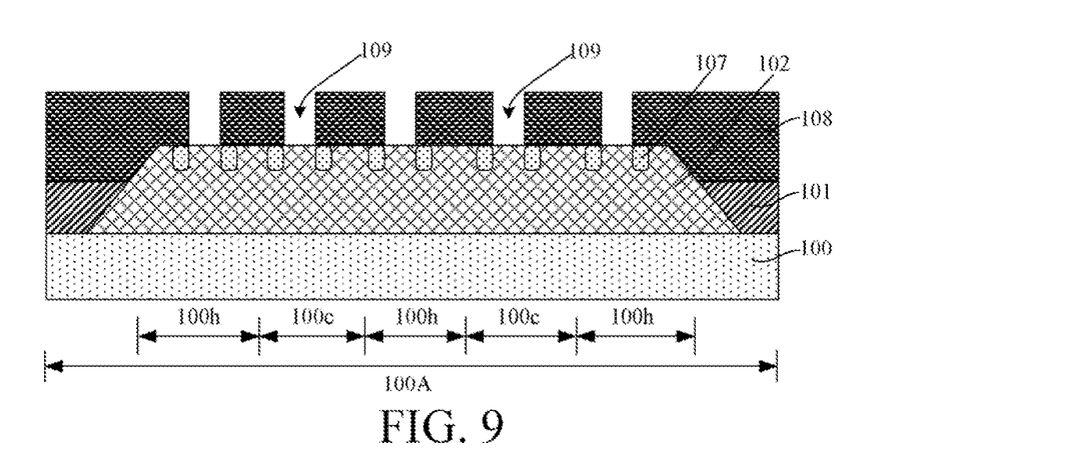

Referring to FIG. 9, the dummy gate structures 106 are removed, to form gate openings 109 in the interlayer dielectric layer 108.

The gate openings 109 provide space for subsequently forming the first gate 114 and the second gate 120. Specifically, the dummy gate structures 106 are removed through a combination of a dry etching process and a wet etching process, which helps completely remove the dummy gate structures 106 while increasing production capacity and reduce damage to the fin 102 while enabling a section of the gate opening 109 to meet process requirements.

Figure 10:
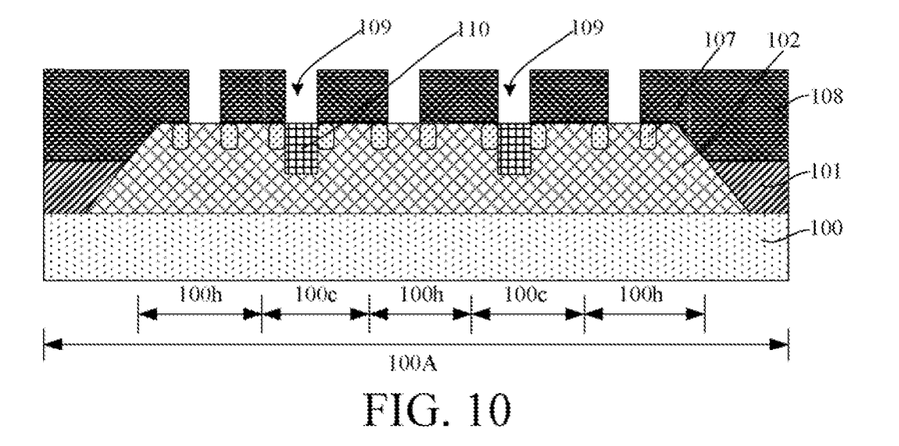

Referring to FIG. 10, second-type ions are injected into the fin 102 at a bottom of the gate opening 109 in a second sub-unit region 100c to form an inversely-doped region 110. A conductivity type of the second-type ions is different from a conductivity type of the first-type ions.

The inversely-doped region 110 means that a type of doped impurity atoms is inverse to a type of original impurity atom type in the fin, so that when the type of the doped region is changed from P-type to N-type or from N-type to P-type, a P-N junction is formed at a position at which concentrations of the two types are equal.

For example, the first-type ions are N-type ions, and the second-type ions are P-type ions. The fin 102 is doped with the first-type ions, and the source/drain doped regions 107 are doped with the first-type ions. After the second-type ions are injected into the fin 102 at the bottom of the gate opening 109 in the second sub-unit region 100c to form the inversely-doped region 110, ions doped in the inversely-doped region 110 and the ions doped in the source/drain doped regions 107 have opposite charges, which easily leads to a relatively high turn-on voltage of a second device, so that the second device is out of operation for a semiconductor. In this way, the second device generates little heat, which can reduce the overall heat from the device unit region 100A, thus ameliorating a self-heating effect in the device unit region 100A, and enhancing the performance of semiconductors accordingly.

In some implementations, the device unit region 100A is an NMOS region, the first-type ions are N-type ions, and the second-type ions are correspondingly P-type ions. The P-type ion is a B ion, a Ga ion, or an In ion.

In other implementations, the device unit region 100A is a PMOS region, the first-type ions are P-type ions, and the second-type ions are correspondingly N-type ions. The N-type ion is a P ion, an As ion, or an Sb ion.

It should be noted that a concentration of the doping ions in the inversely-doped region 110 should be neither excessively small nor excessively large. If the concentration of the doping ions is excessively small, a channel turn-on voltage cannot be effectively suppressed. As a result, a concentration of the inversely-doped region 110 cannot meet process requirements, and the second device can be easily turned on, so that the second sub-unit region 100c can still generate heat. If the concentration of the doping ions is excessively large, the fin 102 is likely to be affected, increasing a risk of device leakage. To this end, in some implementations, when the second-type ions are P-type ions, the concentration of the doping ions in the inversely-doped region 110 is 1.0E19 atoms per cubic centimeter to 2.0E20 atoms per cubic centimeter. When the second-type ions are N-type ions, the concentration of the doping ions in the inversely-doped region 110 is 1.0E19 atoms per cubic centimeter to 2.0E20 atoms per cubic centimeter.

Referring to FIG. 11, a first gate 114 and a second gate 120 are formed in a gate opening 109 after an inversely-doped region 110 is formed.

Specifically, the first gate 114 is formed in the gate opening 109 of the first sub-unit region 100h, and the second gate 120 is formed in the gate opening 109 of a second sub-unit region 100c.

In some implementations, the first gate 114 serves as a device gate configured to control opening and closing of a channel of a first device.

In some implementations, the second gate 120 serves as a dummy gate. Therefore, in a device unit region 100A, only the first device participates in the operation, and the second device is in operation. Accordingly, a second device generates no driving current, so that the overall heat from the device unit region 100A can be reduced without affecting operating performance of the first device, thus ameliorating a self-heating effect of the device unit region 100A, and enhancing the performance of the semiconductor structure accordingly.

In some implementations, the first gate 114 and the second gate 120 are both metal gate structures.

The first gate 114 and the second gate 120 both include: a high-k gate dielectric layer 115 conformally covering a bottom and a side wall of the gate opening 109; a work function layer 116 conformally covering the high-k gate dielectric layer 115; and a gate electrode layer 117 located on the work function layer 116 and filling the gate opening 109.

The high-k gate dielectric layer 115 is made of a high-k dielectric material. The high-k dielectric material is a dielectric material having a relative dielectric constant greater than a relative dielectric constant of silicon oxide. Specifically, the high-k gate dielectric layer 115 may be made of $HfO_2$, $ZrO_2$, HfSiO, HfSiON, HfTaO, HfTiO, HfZrO, $Al_2O_3$, or the like.

The work function layer 116 is configured to adjust a threshold voltage of the formed transistor. When the device unit region 100A is an NMOS region, the work function layer 116 is an N-type work function layer, and a material of the N-type work function layer includes one or more of TiAl, Mo, MON, AlN, and TiAlC. When the device unit region 100A is a PMOS region, the work function layer 116 is a P-type work function layer, and a material of the P-type work function layer includes one or more of TiN, TaN, TaSiN, TaAlN, and TiAlN.

The gate electrode layer 117 is configured to draw electrical properties from the first gate 114. In some implementations, the gate electrode layer 117 is made of Al, Cu, Ag, Au, Pt, Ni, Ti, or W.

It should be noted that, in some implementations, the second-type ions are injected into the fin 102 at the bottom of the gate opening 109 of the second sub-unit region 100c only before the first gate 114 and the second gate 120 are formed in the gate openings 109, to form the inversely-doped region 110, which makes a relatively small change to a current process and has relatively high process compatibility.

In addition, during formation of the dummy gate structure 106, the dummy gate structure 106 is formed not only in the first sub-unit region 100h but also in the second sub-unit region 100c. Therefore, pattern density and density uniformity of the dummy gate structures 106 of the device unit region 100A are increased, reducing impact of a loading effect, thereby facilitating further enhancement of the performance of the semiconductor structure. For example, size uniformity of the dummy gate structures 106 and plainness of a top surface of the interlayer dielectric layer 108 are increased.

Figure 12:
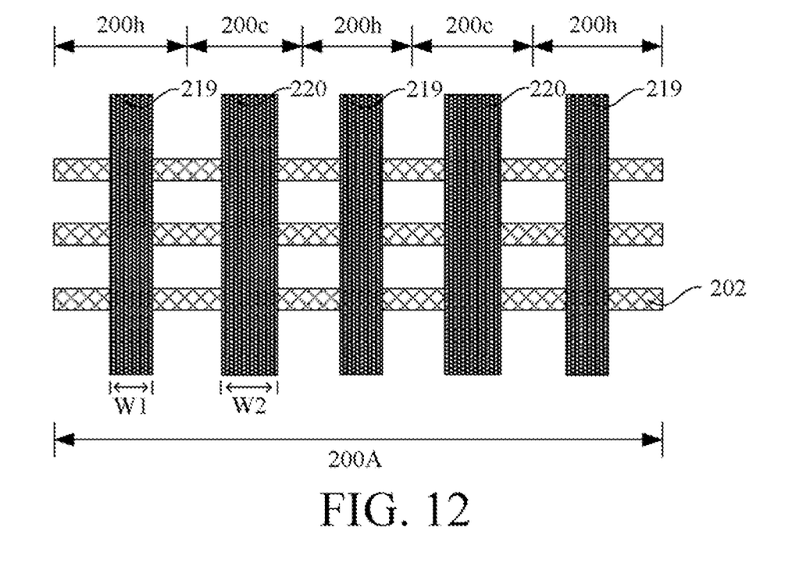
FIG. 12 is a schematic structural diagram corresponding to steps in another form of a method for forming a semiconductor structure.

Referring to FIG. 12, a schematic structural diagram corresponding to steps in another embodiment of a method for forming a semiconductor structure according to the present disclosure is shown.

FIG. 12 is a top view, and for ease of illustration, only a fin 202, a first gate 219, and a second gate 220 are illustrated.

The similarities between the currently described implementations and the aforementioned described implementations are omitted here. A difference between the currently described implementations and the implementations described above lies in that a width W2 of the second gate 220 is greater than a width W1 of the first gate 219.

Specifically, when the width W2 of the second gate 220 is greater than the width W1 of the first gate 219, the second gate 220 is in full contact with the fin 202, so that the second gate 220 generates a smaller operating current, which facilitates dissipation of more heat, thereby reducing heat generated by the second device. The heat generated during operation of the transistor can be significantly reduced without affecting the operating performance of the transistor, thereby improving performance of a semiconductor.

Moreover, the second device is still a valid device, that is, the second device can still operate, thereby improving utilization of a base.

In some implementations, a difference between the width of the second gate 220 and the width of the first gate 219 is 4 nanometers to 100 nanometers.

Specifically, the difference between the width of the second gate 220 and the width of the first gate 219 should be neither excessively large nor excessively small. If the difference between the widths is excessively large, when the width W1 of the first gate 219 is constant, the width of the second gate 220 is likely to be excessively large, causing an excessively large size of the second device, thus impeding improvement of device integration. If the width difference is excessively small, the heat generated during the operation of the first device is likely to be approximate to the heat generated during the operation of the second device, resulting in difficulty in reducing the overall heat from the device unit region. To this end, in some implementations, a difference between the width of the second gate 220 and the width of the first gate 219 is 4 nanometers to 100 nanometers. For example, the difference between the width of the second gate 220 and the width of the first gate 219 is 4 nanometers, 8 nanometers, or 16 nanometers.

In some implementations, the first gate 219 and the second gate 220 are both metal gate structures, and the first gate 219 and the second gate 220 both include a high-k gate dielectric layer, a work function layer located on the high-k gate dielectric layer, and a gate electrode layer located on the work function layer.

The first gate 219 and the second gate 220 are formed in the same manufacturing process. The high-k gate dielectric layers in the first gate and the second gate have the same material and thickness, and the work function layers have the same material and thickness.

For specific descriptions of the forming method in the presently described implementations, reference may be made to the corresponding descriptions in the above embodiments and implementations, as details are not described herein again in the presently described implementations.

Figure 13:
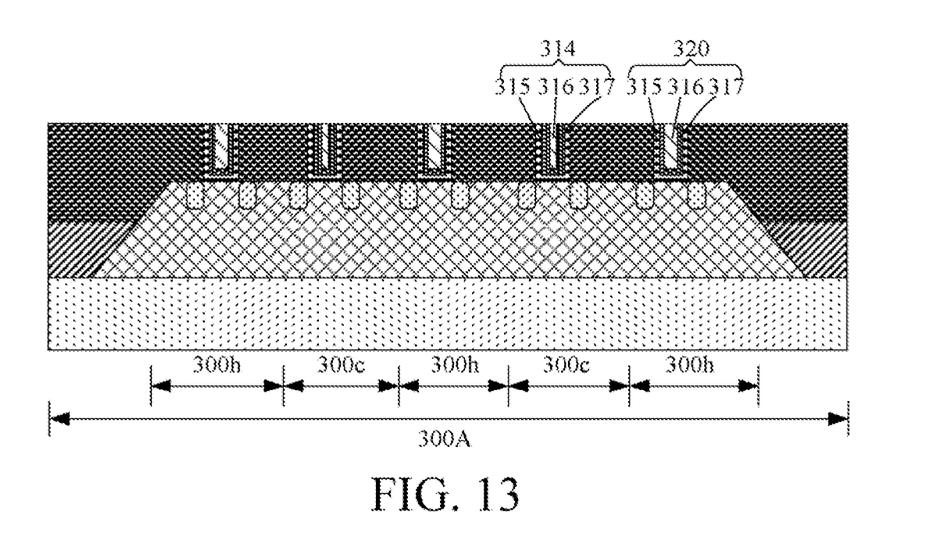
FIG. 13 is a schematic structural diagram corresponding to steps in still another form of a method for forming a semiconductor structure.

Referring to FIG. 13, a schematic structural diagram corresponding to steps in still another form of a method for forming a semiconductor structure according to the present disclosure is shown.

The similarities between the presently described implementations and the aforementioned embodiments and implementations are omitted here. A difference between the presently described embodiment and implementations and the embodiments and implementations described above lies in that a threshold voltage of the second device is greater than a threshold voltage of the first device. The threshold voltage is inversely proportional to the driving current. The threshold voltage of the second device is greater than the threshold voltage of the first device. Accordingly, the driving current of the second device is less than the driving current of the first device. Therefore, during operation of the first device and the second device, the second device generates less heat, so that the overall heat from the device unit region can be reduced, thus ameliorating a self-heating effect of the device unit region and accordingly enhancing the performance of semiconductors.

Moreover, the second device is still a valid device, that is, the second device can still operate, thereby improving utilization of a base.

In some implementations, a difference between the threshold voltage of the second device and the threshold voltage of the first device is 40 mV to 200 mV.

Specifically, the difference between the threshold voltage of the second device and the threshold voltage of the first device should be neither excessively large nor excessively small. If the difference between the threshold voltages is excessively large, when the threshold voltage of the first device is constant, the threshold voltage of the second device is excessively large, resulting in difficulty in turning on the second device, that is, the second device is always in an off state, thus reducing operating performance of the second device. If the difference between the threshold voltages is excessively small, the heat generated by the first device is likely to be approximate to the heat generated by the second device, resulting in difficulty in reducing the overall heat from the device unit region. To this end, in some implementations, the difference between the threshold voltage of the second device and the threshold voltage of the first device is 40 mV to 200 mV. For example, the difference between the threshold voltage of the second device and the threshold voltage of the first device is 60 mV, 100 mV, or 160 mV.

In some implementations, a first gate 320 and a second gate 314 are both metal gate structures, and the first gate 320 and the second gate 314 both include a high-k gate dielectric layer 315, a work function layer 316 located on the high-k gate dielectric layer 315, and a gate electrode layer 317 located on the work function layer 316.

When the work function layers 317 are made of different materials, corresponding work function values are also different, and work function layers 317 of different thicknesses have different work function values. Therefore, the threshold voltage of the first device is different from the threshold voltage of the second device.

As an example, the high-k gate dielectric layers 315 in the first gate 320 and the second gate 314 are made of the same material, and the work function layers 316 in the first gate 320 and the second gate 314 are made of the same material. In some implementations, for example, a device unit region 300A is an NMOS region. The work function layers 316 in the first gate 320 and the second gate 314 are both N-type work function layers. Therefore, a thickness of the work function layer 316 of a second sub-unit region 300c is greater than a thickness of the work function layer 316 of a first sub-unit region 300h.

In some other implementations, when the device unit region is a PMOS region, the work function layers in the first gate and the second gate are both P-type work function layers. Therefore, a thickness of the work function layer of the second sub-unit region is less than a thickness of the work function layer of the first sub-unit region. In other implementations, suitable work function layer materials may further be adopted, so that the threshold voltage of the first device is different from the threshold voltage of the second device.

Correspondingly, the present disclosure further provides a semiconductor structure. Still referring to FIG. 11, a schematic structural diagram of one form of a semiconductor structure according to the present disclosure is shown.

The semiconductor structure includes: a substrate 100 including a device unit region 100A, where the device unit region 100A includes a first sub-unit region 100h configured to form a first device and a second sub-unit region 100c configured to form a second device, and where a driving current of the first device is greater than a driving current of the second device; a fin 102 protruding from the substrate 100; a first gate 114 spanning the fin in the first sub-unit region 100h; and a second gate 120 spanning the fin in the second sub-unit region 100c.

In some implementations, the substrate 100 is made of silicon. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

The fin 102 is configured to provide a channel for operation of a device. In some implementations, the fin 102 is made of the same material as the substrate 100, and the fin 102 is made of silicon.

In some implementations, the device unit region 100A includes the first sub-unit region 100h for the first device and the second sub-unit region 100c for the second device, and the driving current of the first device is greater than the driving current of the second device.

During operation of the devices, the driving current of the first device is greater than the driving current of the second device, and therefore more heat is generated in the first sub-unit region 100h. Therefore, compared with a solution in which the device unit region includes only the first device region, in embodiments and implementations of the present disclosure, by disposing the second sub-unit region 100c in the device unit region, less heat is generated during the operation of the second device, so that overall heat from the device unit region 100A can be reduced, thus ameliorating a self-heating effect in the device unit region 100A, and enhancing the performance of semiconductors accordingly.

In some implementations, the device unit region 100A includes a plurality of first sub-unit regions 100h, and the second sub-unit region 100c is located between the adjacent first sub-unit regions 100h.

The driving current of the first device is greater than the driving current of the second device, so that more heat is generated in the first sub-unit region 100h than in the second sub-unit region 100c. Therefore, disposing the second sub-unit region 100c between the adjacent first sub-unit regions 100h helps avoid accumulation of heat in a specific region, so that the self-heating effect in the device unit region 100A can be greatly improved.

In some implementations, the semiconductor structure further includes: an isolation layer 101 located on the substrate 100 exposed from the fin 102, where the isolation layer 101 covers a part of a side wall of the fin 102, and a top of the isolation layer 101 is lower than a top of the fin 102.

The isolation layer 101 is configured to isolate adjacent devices from each other. The isolation layer 101 may be made of silicon oxide, silicon nitride, or silicon oxynitride. In some implementations, the isolation layer 102 is made of silicon nitride.

A part at which the first gate 114 and the fin 102 intersect is configured to form the first device, and a part at which the second gate 120 and the fin intersect is configured to form the second device.

In some implementations, the first gate 114 serves as a device gate configured to control opening and closing of a channel for the first device in the first sub-unit region 100h. The second gate 120 serves as a dummy gate. Therefore, the second device is a dummy device, and the second device is out of operation.

In some implementations, the second gate 120 serves as a dummy gate. Therefore, the second device is a dummy device, and the second device is out of operation. Accordingly, the second device does not generate a driving current, so that the overall heat from the device unit region 100A can be reduced without affecting operating performance of the first device, thus ameliorating the self-heating effect of the device unit region 100A and enhancing the performance of the semiconductor structure.

In some implementations, the first gate 114 and the second gate 120 have the same width, and the first gate 114 and the second gate 120 are made of the same material and include film layers of the same thickness.

In some implementations, the first gate 114 and the second gate 120 are both metal gate structures.

The first gate 114 and the second gate 120 both include: a high-k gate dielectric layer 115 conformally covering a bottom and a side wall of the gate opening 109; a work function layer 116 conformally covering the high-k gate dielectric layer 115; and a gate electrode layer 117 located on the work function layer 116 and filling the gate opening 109.

The high-k gate dielectric layer 115 is made of a high-k dielectric material. The high-k dielectric material is a dielectric material having a relative dielectric constant greater than a relative dielectric constant of silicon oxide. Specifically, the high-k gate dielectric layer 115 may be made of $HfO_2$, $ZrO_2$, HfSiO, HfSiON, HfTaO, HfTiO, HfZrO, $Al_2O_3$, or the like.

The work function layer 116 is configured to adjust a threshold voltage of the formed transistor. When the device unit region 100A is an NMOS region, the work function layer 116 is an N-type work function layer, and a material of the N-type work function layer includes one or more of TiAl, Mo, MON, AlN, and TiAlC. When the device unit region 100A is a PMOS region, the work function layer 116 is a P-type work function layer, and a material of the P-type work function layer includes one or more of TiN, TaN, TaSiN, TaAlN, and TiAlN.

The gate electrode layer 117 is configured to draw electrical properties from the first gate 114. In some implementations, the gate electrode layer 117 is made of Al, Cu, Ag, Au, Pt, Ni, Ti, or W.

It should be noted that a number of the first gates 114 in the first sub-unit region 100h should be neither excessively small nor excessively large. If the number of the first gates 114 is excessively large, a local temperature of the first sub-unit region 100h is likely to be excessively high, causing a temperature of the device unit region 100A to rise excessively fast, thus reducing an effect of the second device, that is, resulting a non-significant effect of reducing overall heat from the device unit region 100A. As a result, it is difficult to improve a self-heating effect of the device unit region 100A. If the number of the first gates 114 is excessively small, pattern density of the first gate 114 is correspondingly reduced, thus reducing utilization of a base. As a result, it is difficult to improve device integration. To this end, in some implementations, the first sub-unit region 100h includes 1 to 6 first gates 114. For example, there are 2, 3, 4, or 5 first gates 114.

It should be further noted that a number of the second gates 120 in the second sub-unit region 100c should be neither excessively small nor excessively large. If the number of the second gates 120 is excessively large, the number of the first gates 114 is correspondingly reduced, which is likely to affect operating performance of a semiconductor, thus reducing operating efficiency of the semiconductor, and reducing the utilization of the base. As a result, it is difficult to improve the device integration. If the number of the second gates 120 is excessively small, the second device is incapable of significantly reducing the overall heat from the device unit region 100A. As a result, it is difficult to improve the self-heating effect of the device unit region 100A. To this end, in some implementations, the second sub-unit region 100c includes 1 to 3 second gates 120. For example, there are 2 second gates 120.

In some implementations, the semiconductor structure further includes: source/drain doped regions 107 located in the fin 102 on both sides of the first gate 114 and in the fin 102 on both sides of the second gate 120, where doping ions in the source/drain doped regions 107 are first-type ions; and an inversely-doped region 110 located in the fin 102 at a bottom of the second gate 120, where doping ions in the inversely-doped region 110 are second-type ions, and a conductivity type of the second-type ions is different from a conductivity type of the first type ions.

The source/drain doped regions 107 are configured to serve as a source region or a drain region of a transistor. When an NMOS transistor is formed, the source/drain doped regions 107 include a stress layer doped with N-type ions, that is, the first-type ions are N-type ions.

Specifically, the stress layer is made of Si or SiC, and the stress layer provides compression stress for a channel region of the NMOS transistor, thereby facilitating improvement of carrier mobility of the NMOS transistor. The N-type ion is a P ion, an As ion, or an Sb ion. When a PMOS transistor is formed, the source/drain doped regions 107 include a stress layer doped with P-type ions, that is, second-type ions are P-type ions.

The stress layer is made of Si or SiGe, and the stress layer provides compression stress for a channel region of the PMOS transistor, thereby facilitating improvement of carrier mobility of the PMOS transistor. The P-type ion is a B ion, a Ga ion, or an In ion.

The inversely-doped region 110 means that a type of doped impurity atoms is inverse to a type of original impurity atom type in the fin, so that when the type of the doped region is changed from P-type to N-type or from N-type to P-type, a P-N junction is formed at a position at which concentrations of the two types are equal.

For example, the first-type ions are N-type ions, and the second-type ions are P-type ions. The fin 102 is doped with the first-type ions, and the source/drain doped regions 107 are doped with the first-type ions. After the second-type ions are injected into the fin 102 at the bottom of the gate opening 109 in the second sub-unit region 100c to form the inversely-doped region 110, ions doped in the inversely-doped region 110 and the ions doped in the source/drain doped regions 107 have opposite charges, which easily leads to a relatively high turn-on voltage of a second device, so that the second device is out of operation for a semiconductor. In this way, the second device generates little heat, which can reduce the overall heat from the device unit region 100A, thus ameliorating a self-heating effect in the device unit region 100A, and enhancing the performance of semiconductors accordingly.

In some implementations, the device unit region 100A is an NMOS region, the first-type ions are N-type ions, and the second-type ions are correspondingly P-type ions. The P-type ion is a B ion, a Ga ion, or an In ion.

It should be noted that a concentration of the doping ions in the inversely-doped region 110 should be neither excessively small nor excessively large. If the concentration of the doping ions is excessively small, it is more difficult to diffuse second-type doping ions of the inversely-doped region 110 into the fin 102. As a result, a concentration of the inversely-doped region cannot meet process requirements, and the second device is likely to be turned on, and therefore the second sub-unit region 100c can still generate heat. If the concentration of doping ions is excessively high, a risk of device leakage is likely to be increased. To this end, in some implementations, when the second-type ions are P-type ions, the concentration of the doping ions in the inversely-doped region 110 is 1.0E19 atoms per cubic centimeter to 2.0E20 atoms per cubic centimeter. When the second-type ions are N-type ions, the concentration of the doping ions in the inversely-doped region 110 is 1.0E19 atoms per cubic centimeter to 2.0E20 atoms per cubic centimeter.

It should be noted that the semiconductor structure further includes: an interlayer dielectric layer 108 located on the base exposed from the dummy gate structures 106. The interlayer dielectric layer 108 covers side walls of the dummy gate structures 106. The interlayer dielectric layer 108 is configured to isolate adjacent devices from each other. The interlayer dielectric layer 108 is made of an insulating material such as one or more of silicon oxide, silicon nitride, silicon oxynitride, silicon oxycarbide, silicon carbonitride, and silicon oxycarbonitride. In some implementations, the interlayer dielectric layer 108 is made of silicon nitride.

In some implementations, a top of the interlayer dielectric layer 108 is flush with tops of the first gate 114 and the second gate 120. The semiconductor structure may be formed by using the implementations of the forming method described above or may be formed by using other forming methods. For specific descriptions of the currently described semiconductor structure, reference may be made to the corresponding descriptions in the embodiments and implementations described above, as details are not described herein again in the presently described embodiments and implementations.

The present disclosure further provides another form of a semiconductor structure. Still referring to FIG. 12, a schematic structural diagram of another form of a semiconductor structure according to the present disclosure is shown.

FIG. 12 is a top view, and for ease of illustration, only a fin, a first gate, and a second gate are illustrated. The similarities between the present embodiment and the aforementioned embodiments are omitted here. A difference between the present embodiment and the above embodiments lies in that a width W2 of the second gate 220 is greater than a width W1 of the first gate 219.

Specifically, when the width W2 of the second gate 220 is greater than the width W1 of the first gate 219, the second gate 220 is in full contact with the fin 202, so that the second gate 220 generates a smaller operating current, which facilitates dissipation of more heat, thereby reducing heat generated by the second device. The heat generated during operation of the transistor can be significantly reduced without affecting the operating performance of the transistor, thereby providing performance of a semiconductor.

Moreover, the second device is still a valid device, that is, the second device can still operate, thereby improving utilization of a base.

Specifically, the difference between the width of the second gate 220 and the width of the first gate 219 should be neither excessively large nor excessively small. If the difference between the widths is excessively large, when the width W1 of the first gate 219 is constant, the width of the second gate 220 is likely to be excessively large, causing an excessively large size of the second device, thus impeding improvement of device integration. If the width difference is excessively small, the heat generated during the operation of the first device is likely to be approximate to the heat generated during the operation of the second device, resulting in difficulty in reducing the overall heat from the device unit region. To this end, in some implementations, a difference between the width of the second gate 220 and the width of the first gate 219 is 4 nanometers to 100 nanometers. For example, the difference between the width of the second gate 220 and the width of the first gate 219 is 4 nanometers, 8 nanometers, or 16 nanometers.

The semiconductor structure may be formed by using implementations of a forming method described above or may be formed by using other forming methods. For specific descriptions of the semiconductor structure in the presently described implementations, reference may be made to the corresponding descriptions in embodiments and implementations described above, as details are not described herein again in the presently described implementations.

The present disclosure further provides yet another form of a semiconductor structure. Still referring to FIG. 13, a schematic structural diagram of another form of a semiconductor structure according to the present disclosure is shown.

The similarities between the presently described implementations and the aforementioned embodiments and implementations are omitted here. A difference between the presently described implementations and the embodiments and implementations described above lie in that a threshold voltage of the second device is greater than a threshold voltage of the first device.

The threshold voltage is inversely proportional to the driving current. The threshold voltage of the second device is greater than the threshold voltage of the first device. Accordingly, the driving current of the second device is less than the driving current of the first device. Therefore, during operation of the first device and the second device, the second device generates less heat, so that the overall heat from the device unit region can be reduced, thus ameliorating a self-heating effect of the device unit region, and enhancing the performance of semiconductors accordingly.

Moreover, the second device is still a valid device, that is, the second device can still operate, thereby improving utilization of a base. Specifically, the difference between the threshold voltage of the second device and the threshold voltage of the first device should be neither excessively large nor excessively small. If the difference between the threshold voltages is excessively large, when the threshold voltage of the first device is constant, the threshold voltage of the second device is excessively large, resulting in difficulty in turning on the second device, that is, the second device is always in an off state, thus reducing operating performance of the second device. If the difference between the threshold voltages is excessively small, the heat generated by the first device is likely to be approximate to the heat generated by the second device, resulting in difficulty in reducing the overall heat from the device unit region. To this end, in some implementations, the difference between the threshold voltage of the second device and the threshold voltage of the first device is 40 mV to 200 mV. For example, the difference between the threshold voltage of the second device and the threshold voltage of the first device is 60 mV, 100 mV, or 160 mV.

In some implementations, a first gate 320 and a second gate 314 are both metal gate structures, and the first gate 320 and the second gate 314 both include a high-k gate dielectric layer 315, a work function layer 316 located on the high-k gate dielectric layer 315, and a gate electrode layer 317 located on the work function layer 316.

When the work function layers 317 are made of different materials, corresponding work function values are also different, and work function layers 317 of different thicknesses have different work function values. Therefore, the threshold voltage of the first device is different from the threshold voltage of the second device.

As an example, the high-k gate dielectric layers 315 in the first gate 320 and the second gate 314 are made of the same material, and the work function layers 316 in the first gate 320 and the second gate 314 are made of the same material. In some implementations, for example, a device unit region 300A is an NMOS region. The work function layers 316 in the first gate 320 and the second gate 314 are both N-type work function layers. Therefore, a thickness of the work function layer 316 of a second sub-unit region 300c is greater than a thickness of the work function layer 316 of a first sub-unit region 300h.

In some other implementations, when the device unit region 300A is a PMOS region, the work function layers 316 in the first gate 320 and the second gate 314 are both P-type work function layers. Therefore, a thickness of the work function layer 316 of the second sub-unit region 300c is less than a thickness of the work function layer 316 of the first sub-unit region 300h.

In other implementations, suitable work function layer materials may further be adopted, so that the threshold voltage of the first device is different from the threshold voltage of the second device.

The semiconductor structure may be formed by using implementations of the forming methods described above or may be formed by using other forming methods. For specific descriptions of the presently described semiconductor structure, reference may be made to the corresponding descriptions of embodiments and implementations described above, as details are not described herein again in the present implementations.

Although the present disclosure is disclosed above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising:
a substrate comprising a device unit region, wherein the device unit region includes a plurality of first sub-unit regions and a second sub-unit region located between adjacent first sub-unit regions, the plurality of first sub-unit regions includes a first sub-unit region configured to form a first device, and the second sub-unit region is configured to form a second device, wherein a driving current of the first device is greater than a driving current of the second device;
a fin protruding from the substrate;
a plurality of first gates spanning the fin in the first sub-unit region, each of the plurality of first gates comprising a first work function layer;
a plurality of second gates spanning the fin in the second sub-unit region, each of the plurality of second gates comprising a second work function layer and a thickness of the second work function layer being different from a thickness of the first work function layer, wherein number of the plurality of second gates is less than a number of the plurality of first gates; and
an inversely-doped region located in the fin at a bottom of the second gate, wherein concentration of doping ions in the inversely-doped region is 1.0E19 atoms per cubic centimeter to 2.0E20 atoms per cubic centimeter.

2. The semiconductor structure according to claim 1, wherein a threshold voltage of the second device is greater than a threshold voltage of the first device.

3. The semiconductor structure according to claim 2, wherein a difference between the threshold voltage of the second device and the threshold voltage of the first device ranges from 40 mV to 200 mV.

4. The semiconductor structure according to claim 1, wherein a width of the second gate is greater than a width of the first gate.

5. The semiconductor structure according to claim 4, wherein a difference between the width of the second gate and the width of the first gate ranges from 4 nanometers to 100 nanometers.

6. The semiconductor structure according to claim 1, further comprising:
source/drain doped regions located in the fin on both sides of the first gate and in the fin on both sides of the second gate, wherein doping ions in the source/drain doped regions are first-type ions,
wherein the doping ions in the inversely-doped region are second-type ions, and a conductivity type of the second-type ions is different from a conductivity type of the first-type ions.

7. The semiconductor structure according to claim 6, wherein:
the device unit region is an NMOS region, the first-type ions are N-type ions, and the second-type ions are P-type ions; or the device unit region is a PMOS region, the first-type ions are P-type ions, and the second-type ions are N-type ions.

8. A method for forming a semiconductor structure, comprising:
   providing a substrate and a fin protruding from the substrate, wherein the substrate comprises a device unit region, wherein the device unit region comprises a plurality of first sub-unit regions and a second sub-unit region located between adjacent first sub-unit regions, the plurality of first sub-unit regions includes a first sub-unit region configured to form a first device, and the second sub-unit region is configured to form a second device, wherein a driving current of the first device is greater than a driving current of the second device;
   forming a plurality of first gates spanning the fin in the first sub-unit region and a plurality of second gates spanning the fin in the second sub-unit region, each of the plurality of first comprising a first work function layer, each of the plurality of second gates comprising a second work function layer, and a thickness of the second work function layer being different from a thickness of the first work function layer, wherein a number of the plurality of second gates is less than a number of the plurality of first gates; and
   forming an inversely-doped region in the fin at a bottom of the second gate, wherein concentration of doping ions in the inversely-doped region is 1.0E19 atoms per cubic centimeter to 2.0E20 atoms per cubic centimeter.

9. The method for forming a semiconductor structure according to claim 8, wherein a threshold voltage of the second device is greater than a threshold voltage of the first device.

10. The method for forming a semiconductor structure according to claim 9, wherein a difference between the threshold voltage of the second device and the threshold voltage of the first device ranges from 40 mV to 200 mV.

11. The method for forming a semiconductor structure according to claim 8, wherein a width of the second gate is greater than a width of the first gate.

12. The method for forming a semiconductor structure according to claim 11, wherein a difference between the width of the second gate and the width of the first gate ranges from 4 nanometers to 100 nanometers.

13. The method for forming a semiconductor structure according to claim 8, wherein the forming method further comprises, before forming the first gate and the second gate:
   forming dummy gate structures respectively spanning the fin in the first sub-unit region and the fin in the second sub-unit region;
   forming source/drain doped regions in the fin on both sides of the dummy gate structures, wherein doping ions in the source/drain doped regions are first-type ions;
   forming an interlayer dielectric layer on the substrate exposed from the dummy gate structures after the forming the source/drain doped regions, wherein the interlayer dielectric layer covers side walls of the dummy gate structures;
   removing the dummy gate structures to form gate openings in the interlayer dielectric layer;
   injecting second-type ions into the fin at a bottom of the gate opening in the second sub-unit region to form an inversely-doped region, wherein a conductivity type of the second-type ions is different from a conductivity type of the first-type ions; and
   forming the first gate and the second gate in the gate openings after the forming the inversely-doped region.

14. The method for forming a semiconductor structure according to claim 13, wherein:
   the device unit region is an NMOS region, the first-type ions are N-type ions, and the second-type ions are P-type ions; or
   the device unit region is a PMOS region, the first-type ions are P-type ions, and the second-type ions are N-type ions.

* * * * *